(12) United States Patent
Grise et al.

(10) Patent No.: US 8,538,718 B2
(45) Date of Patent: Sep. 17, 2013

(54) CLOCK EDGE GROUPING FOR AT-SPEED TEST

(75) Inventors: Gary D. Grise, Colchester, VT (US); Vikram Iyengar, Pittsburgh, PA (US); Douglas E. Sprague, Jericho, VT (US); Mark R. Taylor, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 12/967,885

(22) Filed: Dec. 14, 2010

(65) Prior Publication Data

US 2012/0150473 A1 Jun. 14, 2012

(51) Int. Cl.
G06F 19/00 (2011.01)
(52) U.S. Cl.
USPC .......................................... 702/117
(58) Field of Classification Search
USPC ................................ 702/117, 182; 716/17, 18
See application file for complete search history.

(56) References Cited

U.S. PATENT DOCUMENTS

| | | | |
|---|---|---|---|
| 4,868,414 A | 9/1989 | Kanazawa | |
| 5,991,888 A | 11/1999 | Faulkner et al. | |
| 6,028,983 A | 2/2000 | Jaber | |
| 6,106,568 A * | 8/2000 | Beausang et al. | 716/102 |
| 6,629,277 B1 | 9/2003 | Sanghani | |
| 7,134,061 B2 | 11/2006 | Agashe et al. | |
| 7,155,651 B2 | 12/2006 | Nadeau-Dostie et al. | |
| 7,188,326 B2 | 3/2007 | Yoshida | |
| 7,380,109 B2 | 5/2008 | Henry et al. | |
| 7,424,417 B2 | 9/2008 | Guettaf | |
| 7,529,294 B2 | 5/2009 | Grise et al. | |
| 7,685,542 B2 | 3/2010 | Grise et al. | |
| 7,721,170 B2 | 5/2010 | Grise et al. | |
| 2006/0242474 A1 | 10/2006 | Jun et al. | |
| 2007/0130492 A1 | 6/2007 | Jamkhandi | |
| 2008/0141086 A1 * | 6/2008 | Huang et al. | 714/726 |
| 2009/0150844 A1 | 6/2009 | Iyengar et al. | |
| 2009/0160492 A1 | 6/2009 | Hailu et al. | |
| 2009/0265677 A1 | 10/2009 | Grise et al. | |

OTHER PUBLICATIONS

Grover, G. A., "Clock Distribution Algorithm for Network", IP.com: Prior Art Database, Originally published Jan. 1, 1990, Electronically published Mar. 14, 2005, 5 pages.

* cited by examiner

Primary Examiner — Bryan Bui
(74) Attorney, Agent, or Firm — Michael Lestrange; Roberts Mlotkowski Safran & Cole, P.C.

(57) ABSTRACT

A method of grouping clock domains includes: separating a plurality of test clocks into a plurality of domain groups by adding to each respective one of the plurality of domain groups those test clocks that originate from a same clock source and have a unique clock divider ratio; sorting the domain groups in decreasing order of size; and creating a plurality of parts by adding the respective one of the plurality of domain groups to a first one of the plurality of parts in which already present test clocks have a different clock source, and creating a new part and adding the respective one of the plurality of domain groups to the new part when test clocks present in the respective one of the plurality of domain groups originate from a respective same clock source and have a different clock divider ratio as test clocks present in all previously-created parts.

20 Claims, 7 Drawing Sheets

CLOCK EDGE GROUPING FOR AT-SPEED TEST

FIELD OF THE INVENTION

The present invention relates generally to integrated circuit testing techniques and, more particularly, to a method and system for separating a plurality of test clocks from a test group into a plurality of parts for at-speed test.

BACKGROUND

The testing of integrated circuits has evolved into a highly developed area of technology. Generally such testing may be implemented through the use of external equipment, Built-In Self-Test (BIST) circuitry, or a combination of the two. Typically, all test methodologies involve shifting data into scannable memory elements of an integrated circuit device (e.g., Level Sensitive Scan Design or LSSD latches), capturing the input to the memory elements, shifting the captured data out and then comparing the captured data with predetermined values to determine whether the circuit has performed according to design. Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (i.e., "functional testing"), as well as detecting fabrication defects (i.e., "structural testing").

"At-speed" testing refers to testing techniques to detect defects that are only apparent when the circuit is running at system speed. Many time-based defects cannot be detected unless the circuit is run at-speed. Examples of time related defects that occur at-speed include high impedance shorts, in-line resistance, and cross talk between signals. A problem of particular concern in regard to at-speed structural testing (ASST) is that the testing of multiple synchronous and asynchronous clock domains while using functional clocks generated by phase locked loops (PLLs) is computationally intensive and prone to poor coverage. One known methodology models chip-internal at-speed clocks, e.g., functional clocks that are inside the chip, as four clock edges in the test sequence. However, in a test group having more than one domain, the number of clock edges exponentially increases, resulting in too many events to simulate which results in long test generation times and low test coverage results.

Accordingly, there exists a need in the art to overcome the deficiencies and limitations described hereinabove.

SUMMARY

In a first aspect of the invention, there is a method of grouping clock domains for testing an integrated circuit. The method is implemented using a computer device comprising a processor and includes separating a plurality of test clocks into a plurality of domain groups by adding to each respective one of the plurality of domain groups those test clocks that originate from a same clock source and have a unique clock divider ratio. The method includes sorting the plurality of domain groups in decreasing order of size. The method includes creating a plurality of parts by performing one of the following for each respective one of the plurality of domain groups in the decreasing order of size: (i) adding the respective one of the plurality of domain groups to a first one of the plurality of parts in which already present test clocks have a different clock source; and (ii) creating a new part and adding the respective one of the plurality of domain groups to the new part when test clocks present in the respective one of the plurality of domain groups originate from a respective same clock source and have a different clock divider ratio as test clocks present in all previously-created parts.

In another aspect of the invention, there is a system including a computer device including a processor, a memory, and an application stored in the memory and executable on the processor. The application operates to arrange a plurality of clock domains into a plurality of groups by iteratively performing one of the following for each respective one of the plurality of clock domains: (i) adding the respective one of the plurality of clock domains to an existing one of the plurality of groups when the respective one of the plurality of clock domains either: does not communicate with any other clock domains contained within the existing one of the plurality of groups, or has a same frequency and duty cycle and is synchronous to any other clock domain contained within the existing one of the plurality of groups; and (ii) creating a new one of the plurality of groups and adding the respective one of the plurality of clock domains to the new one of the plurality of groups when the respective one of the plurality of clock domains is synchronous with and at a different frequency than any other clock domain contained within any existing one of the plurality of groups.

In yet another aspect of the invention, there is a computer program product comprising a computer-readable code embodied on a computer readable storage medium. The computer-readable code, when executed on a computer device, causes the computer device to separate a plurality of test clocks into a plurality of domain groups by adding to each respective one of the plurality of domain groups those test clocks that originate from a same clock source and have a unique clock divider ratio. The computer-readable code causes the computer device to sort the plurality of domain groups in decreasing order of size. The computer-readable code causes the computer device to create a plurality of parts by performing one of the following for each respective one of the plurality of domain groups in the decreasing order of size: (i) adding the respective one of the plurality of domain groups to a first one of the plurality of parts in which already present test clocks have a different clock source; and (ii) creating a new part and adding the respective one of the plurality of domain groups to the new part when test clocks present in the respective one of the plurality of domain groups originate from a same clock source and have a different clock divider ratio as test clocks present in all previously-created parts. The computer-readable code causes the computer device to model all of the test clocks contained within a respective one of the plurality of parts using a respective group of clock edges, and perform an at-speed structural test of an integrated circuit using the plurality of parts.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates generally to integrated circuit testing techniques and, more particularly, to a method and system for separating a plurality of test clocks from a test group into a plurality of parts for at-speed test. In accordance with aspects of the invention, clock domains that are used in test generation in the testing of integrated circuits are grouped together according to predefined rules. Each group of clock domains is modeled using a plurality of clock edges (e.g., four clock edges per group), rather than each clock domain being modeled with its own four clock edges. The grouping of domains and use of four clock edges per group reduces the total number of clock edges used in the testing. This reduction of the number of clock edges reduces computational complexity of the test, which reduces test generation time and increases test coverage.

In embodiments, the clock domains are grouped according to predefined rules based on the synchronous/asynchronous relation between the domains and also based on data transfer between the domains. According to aspects of the invention, a respective virtual test clock is used to represent all of the functional clocks in a particular group of clock domains. The virtual clock label may be back-propagated to each phase lock loop (PLL) and each physical clock source form which the group of physical clocks originate. In the test generation programming and/or logic, the virtual clocks are used for clock waveforms instead of using the physical clocks. Once the test patterns containing the virtual clock waveforms have been crated, these clock waveforms may be applied to the actual integrated circuit hardware pins using test equipment that has stored the test wave patterns.

Figure 1:
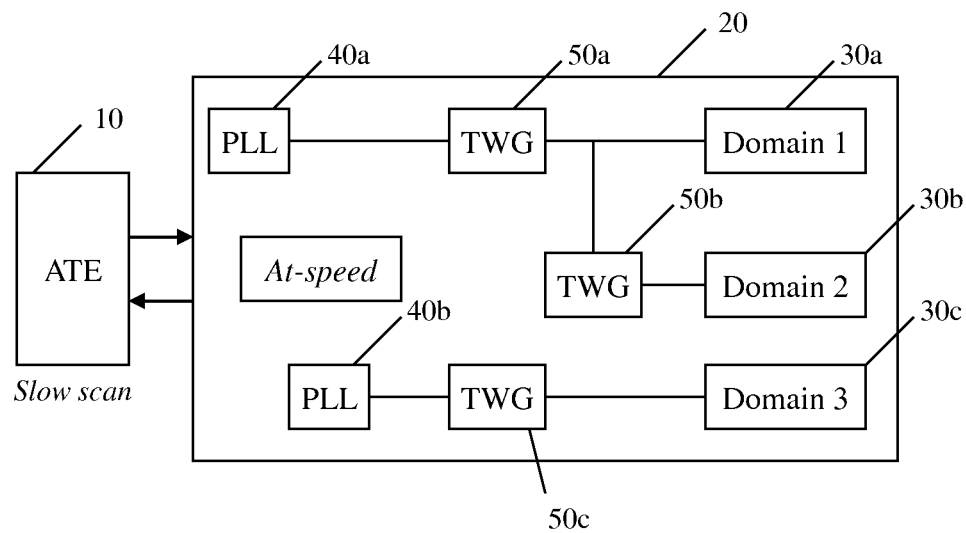
FIG. 1 shows a block diagram depicting an at-speed structural test (ASST) methodology.

FIG. 1 shows a block diagram depicting an at-speed structural test (ASST) methodology. Test patterns are scanned in at relatively slow tester speeds from automated test equipment (ATE) 10. At block 20, the tests are applied at a relative faster functional speed than in ATE 10. As depicted in FIG. 1, clock domains 30a and 30b are grouped together with a single phase lock loop (PLL) 40a. Domain 30c is associated with a separate PLL 40b. Grouping clock domains (e.g., 30a and 30b) for testing saves test generation time, test data, and test application time, and also increases the fault coverage. However, grouping clock domains does not result in any decrease in the number of clock edges, since each respective domain 30a-c has its own test waveform generator (TWG) 50a-c.

Figure 2:
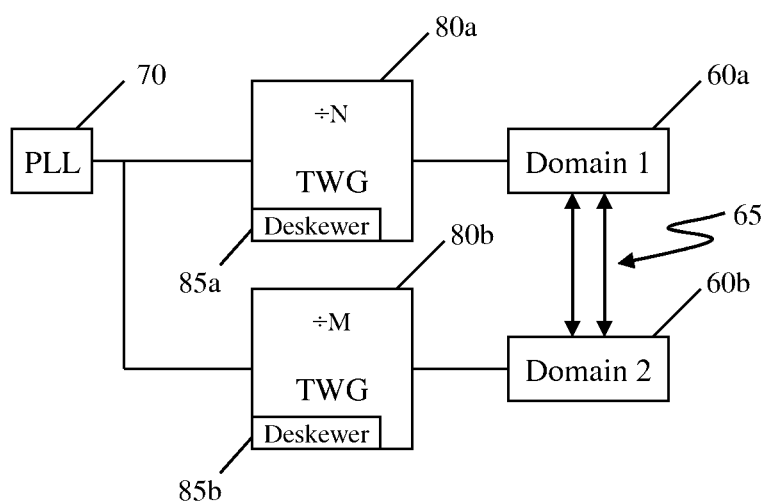
FIG. 2 shows a block diagram depicting simultaneous testing of two clock domains.

FIG. 2 shows a block diagram depicting simultaneous testing of two clock domains 60a, 60b. To be able to test domains 60a and 60b simultaneously, any data 65 crossing between the domains 60a, 60b must close timing for a single cycle (e.g., not be asynchronous) or have any asynchronous paths blocked. Both clock domains 60a, 60b are fed from the same PLL 70 which permits synchronously starting clocks in both domains 60a, 60b. The PLL 70 may receive a reference clock from a tester (not shown). Each clock domain 60a, 60b has an associated TWG 80a, 80b that takes the functional clock from the PLL 70 and generates an at-speed test clock with a programmable number of pulses. Each TWG 80a, 80b may have a respective divider ratio (e.g., "N" for TWG 80a and "M" for TWG 80b) that sets the frequency. Each TWG 80a, 80b may also include a respective deskewer 85a, 85b that functions as a high-speed multiplexer that provides for generation of an output clock with a minimum amount of skew. Under test, the output of both TWG 80a and 80b starts with a coincident edge.

A test group is a group of clock domains that can be tested together using a single clock source (e.g., PLL), such as domains 60a and 60b described with respect to FIG. 2. Test groups may be identified either by the designer or by using timing analysis software known to those of skill in the art. Clock domains that are asynchronous typically are grouped together in a same test group only if there are no datapaths between the asynchronous domains. For example, a first domain of 250 MHz driven by a first PLL is asynchronous to a second domain of 333 MHz driven by a second PLL. These two domains typically can only be in the same test group if there are no datapaths between them.

Figure 3:
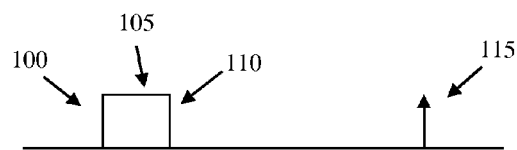
FIG. 3 shows a rectangular clock pulse and a zero-width clock impulse.

Physical clocks produce a clock pulse that is rectangular in shape, with a rising edge 100, a plateau 105, and a falling edge 110, as shown in FIG. 3. Test generators model test clock waveforms as zero-width impulses 115. A zero-width impulse 115 models the entire physical clock pulse (both the rising and falling edge) with a zero-width pulse. The zero-width impulse 115 works well for static (e.g., DC) tests in which frequency is not an issue, however, the zero-width pulse is ill-suited for at-speed tests where frequencies are tested and synchronous domain interaction is modeled. This is because data transfer between domains starts on the rise (or fall) of one pulse and ends on the rise (or fall) of another pulse. Real data transfers between domains with two clock pulses on each domain will in some cases test at speed with zero-width impulses, but often will test slower than timed closure.

In particular, test generators may fail with incorrect predictions between domains when both rising and falling edge flops are involved or when there are clock inversions within a domain. Depending on divider ratios and number of pulses, prediction failures can occur in either direction, i.e., slow to fast, and fast to slow. Slow to fast always fails when mixed flop types or clock inversions are present. For example, FIGS. 4-6 depict how such failures may occur.

Figure 4:
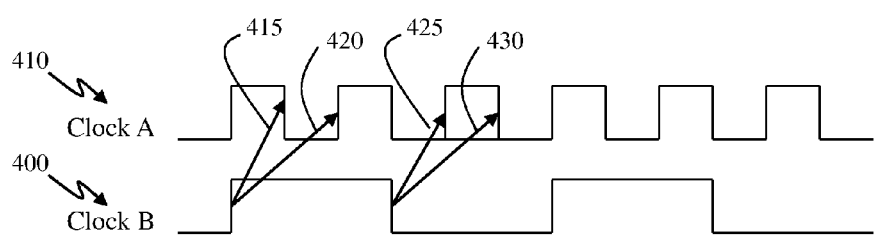
FIGS. 4-6 shows timing for data transfers from a slow domain to a fast domain.

FIG. 4 shows timing for data transfers from a slow domain 400 (e.g., Clock B) to a fast domain 410 (e.g., Clock A), e.g., a slow-to-fast timing scenario. The rising edge to falling edge transfer 415 occurs on a half cycle. The rising edge to rising edge transfer 420 occurs on a full cycle. The falling edge to rising edge transfer 425 occurs on a half cycle, and the falling edge to falling edge transfer occurs on a full cycle.

Figure 5:
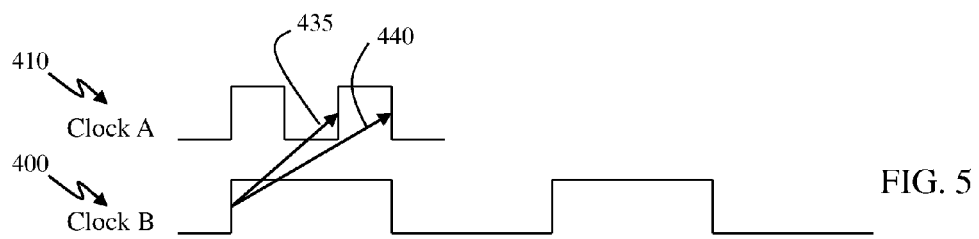

FIG. 5 depicts modeling the domains 400 and 410 each with two rectangular pulses. The rising edge to falling edge transfer 435 occurs on one and one-half cycles, and the rising edge to rising edge transfer 440 occurs on one full cycle. However, the falling edge data launch of the slow domain 400 is too late to be captured in the fast domain 410, such that there is no data transfer for the falling edge to rising edge and no data transfer for the falling edge to falling edge.

Figure 6:
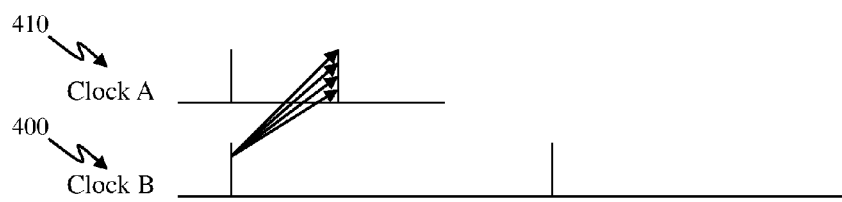

FIG. 6 depicts modeling the domains 400 and 410 each with zero width impulses. The rising edge to falling edge transfer occurs on four and one-half cycles, and the rising edge to rising edge transfer occurs on three cycles. The falling edge to rising edge transfer occurs on two and one-half cycles, and the falling edge to falling edge transfer occurs on four and one-half cycles.

In view of the deficiencies of zero-width impulses, clock edges may alternatively be used to model physical clock pulses. Test generators use a clock edge to represent either the rising edge or the falling edge of the rectangular clock pulse.

As such, there are two clock edges per clock pulse, as opposed to a single zero-width impulse per clock pulse. As such, chip-internal at-speed clocks are modeled as four clock edges in the test sequence. However, although the use of clock edges compensates for the data transfer problems associated with zero-width pulses, the use of clock edges can be computationally intensive. For example, in test groups having more than one domain, the use of clock edges can result in too many events to simulate. This, in turn, leads to long test generation times and low test coverage results.

Figure 7:
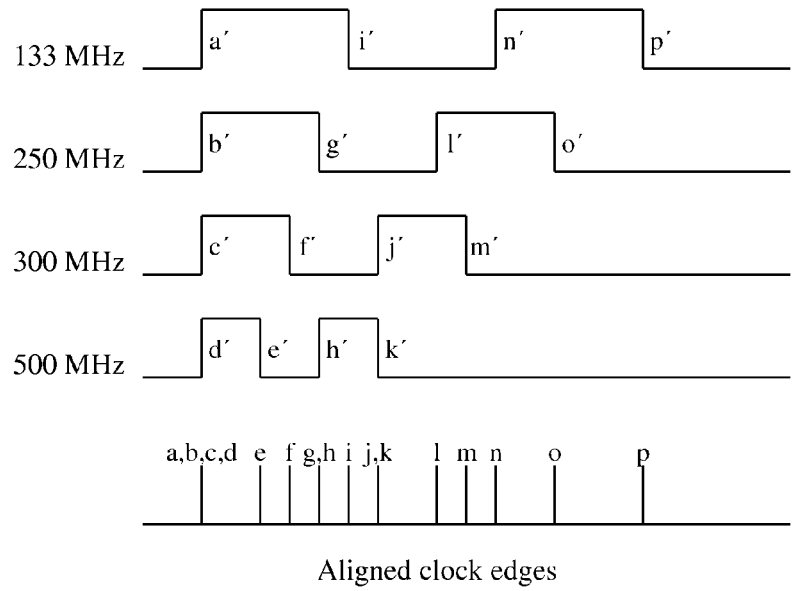
FIG. 7 depicts a test group containing four functional clocks.

FIG. 7 depicts a test group containing four functional clocks: a 133 MHz clock, a 300 MHz clock, and a synchronous couple of a 250 MHz clock and a 500 MHz clock. Each clock is modeled as four respective clock edges "a" through "p" on the bottom portion of the Figure showing the aligned clock edges. The clock edges a-p correspond to the rising and falling edges a' through p' of the pulses. At each respective clock edge (e.g., edge a) there may be a data transfer to any of the other fifteen clock edges (e.g., edges b-p), with each data transfer comprising a data transfer between thousands of latches, all of which is simulated. The computational complexity increases exponentially as the size of the test group grows. Such high computational complexity may result in prohibitively long test generation times and unsatisfactorily low test coverage results.

According to aspects of the invention, domains are grouped together to use a common plurality of clock edges (e.g., four clock edges) rather than generating unique clock edges per domain. In this manner, the number of total clock edges is reduced since some domains share the same four clock edges rather than each domain having its own four clock edges. This grouping of clock edges reduces the overall computational complexity of the test, which reduces test generation time and increases test coverage.

In embodiments, domains are grouped together to use the same clock edges based upon predefined rules. For example, a first rule may be that domains that do not communicate with each other (e.g., no data transfer between the domains) may be grouped together. A second rule may be that synchronous domains that communicate with one another may be grouped together. A third rule may be that synchronous domains having different frequencies are separated into separate groups.

Figure 8:
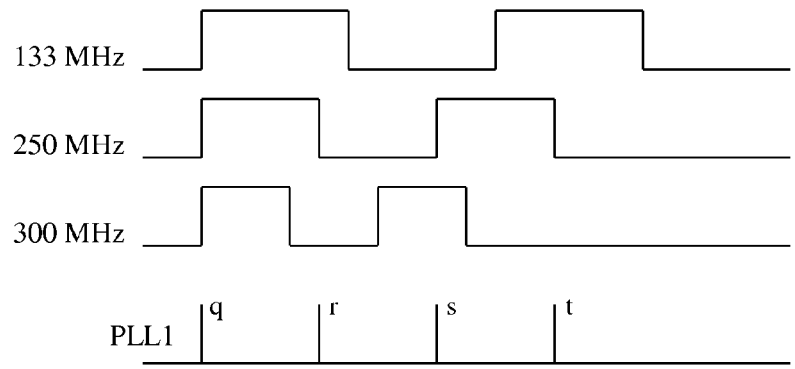
FIG. 8 shows grouping clock edges by grouping domains in accordance with aspects of the invention.

Applying these rules to the example from FIG. 7, the 133 MHz, 250 MHz, and 300 MHz domains are all asynchronous and do not communicate with each other. According to aspects of the invention and as shown in FIG. 8, these three domains (e.g., the 133 MHz, 250 MHz, and 300 MHz domains) may be grouped together and modeled by four clock edges q-t (rather than the twelve clock edges as in FIG. 7). The 500 MHz domain is synchronous with and at a different frequency than the 250 MHz domain, such that the 500 MHz domain is not grouped in the same group as the 250 MHz domain. As such, the 500 MHz domain is modeled using four other clock edges u-x. By grouping the domains in accordance with aspects of the invention, the test generation sequencing may be performed using eight clock edges (e.g., edges q-x) as in FIG. 8, rather than using sixteen clock edges (e.g., edges a-p) as in FIG. 7.

In accordance with aspects of the invention, a virtual test clock represents many actual functional clocks in a group of domains, rather than each domain having its own physical test clock. For example, after the domains have been grouped in accordance with the methods described herein, the test generator is told that all of the functional clocks within a group are connected to the same virtual clock source, even though the functional clocks are not physically connected to the same physical clock source. The use of a virtual test clock is a departure from systems that use a single test clock that is physically added to a chip such that in test mode all clock domains are clocked by that single test clock. The single test clock approach has problems such as: extra lock-up latches are needed for scan; clock skews are created; tests are run at slower than at-speed to allow handshaking logic to work correctly; and functional clocks cannot be tested or used for test.

In embodiments, the virtual test clock is implemented by first creating a software model of the integrated circuit. The actual different physical clocks (e.g., clock domains) are grouped according to the grouping methods described herein. The actual physical clocks in each respective group are given a new respective virtual clock label in the circuit (e.g., each group has its own virtual clock label). Each respective virtual clock label is also back propagated to each PLL and each physical clock source from which the group of physical clocks originate. In the test generation programming and/or logic, the virtual clock labels are used for clock waveforms instead of using the physical clocks. Test patterns containing the virtual clock waveforms are created, and these clock waveforms are applied to the actual integrated circuit hardware pins using test equipment that has stored the test pattern waveforms.

As described with respect to FIG. 8, and in accordance with aspects of the invention, clock domains may be grouped based on predefined rules to reduce the number of clock edges used during testing. In embodiments, a first rule is that domains that do not communicate with each other may be grouped together. This first rule is directed to asynchronous domains that do not communicate with one another. Such domains may be grouped together and represented by a single virtual test clock and modeled using the same four clock edges.

In embodiments, a second rule is that synchronous domains that communicate and which are at the same frequency may be grouped together and represented by a single virtual test clock. In particular, domains are grouped together and modeled using the same four clock edges when the domains are clocked by the same PLLOUT pin of the same PLL, have the same duty cycle, and have the same deskewer dividers. These same-frequency clock domains have coincident rising and falling edges, so that the same four clock edges can be used to model all of these clocks.

In embodiments, a third rule is that synchronous domains from a same test group (e.g., a test group as described in FIGS. 1 and 2) and at different frequencies are separated into different groups and represented by different virtual clocks. In particular, domains from the same PLLOUT pin of the same PLL but having different deskewer dividers are grouped separately. These different-frequency, synchronous (e.g., communicating) domains do not have coincident rising and falling edges, such that their respective pulse widths may lead to failures if common clock edges were used. Accordingly, these different-frequency, synchronous domains are separated into different groups.

Figure 9:
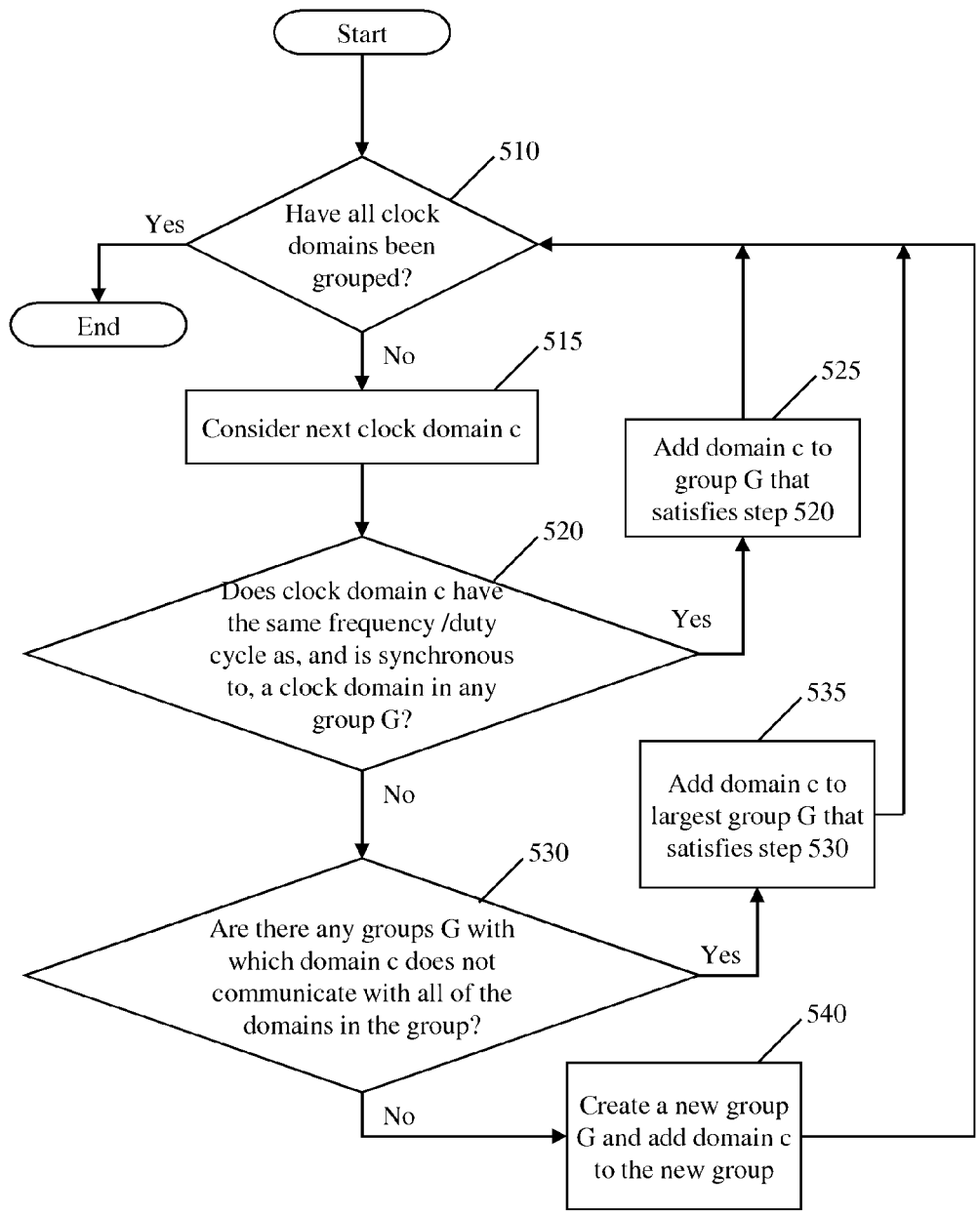
FIGS. 9-11 depict exemplary processes in accordance with aspects of the present invention.
Figure 10:
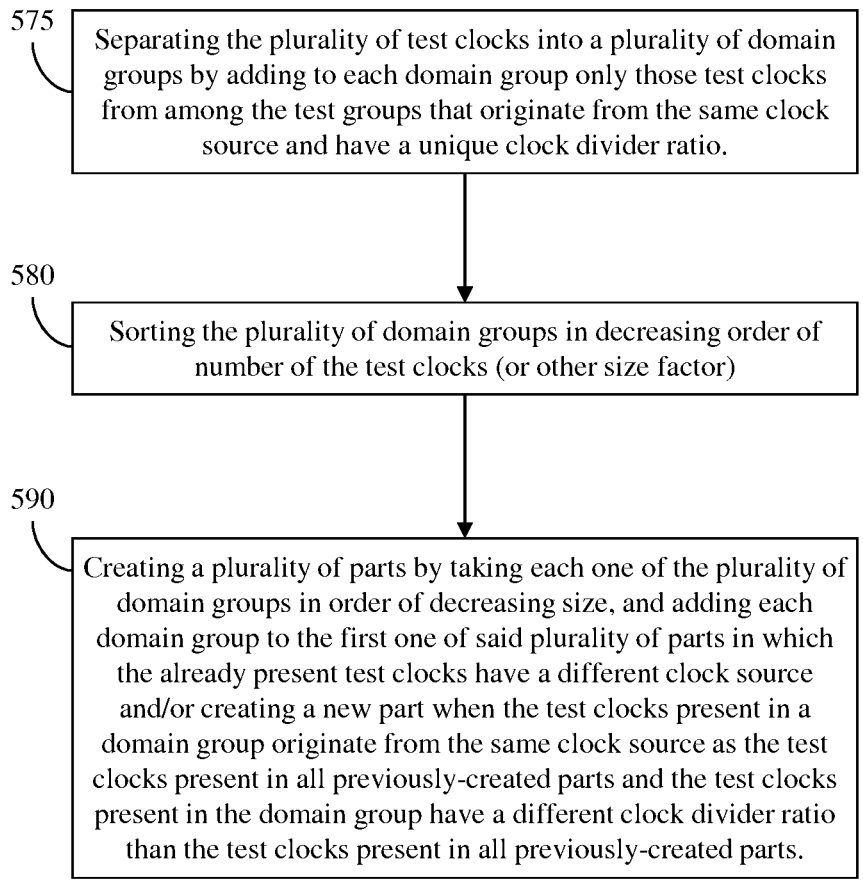
Figure 11:
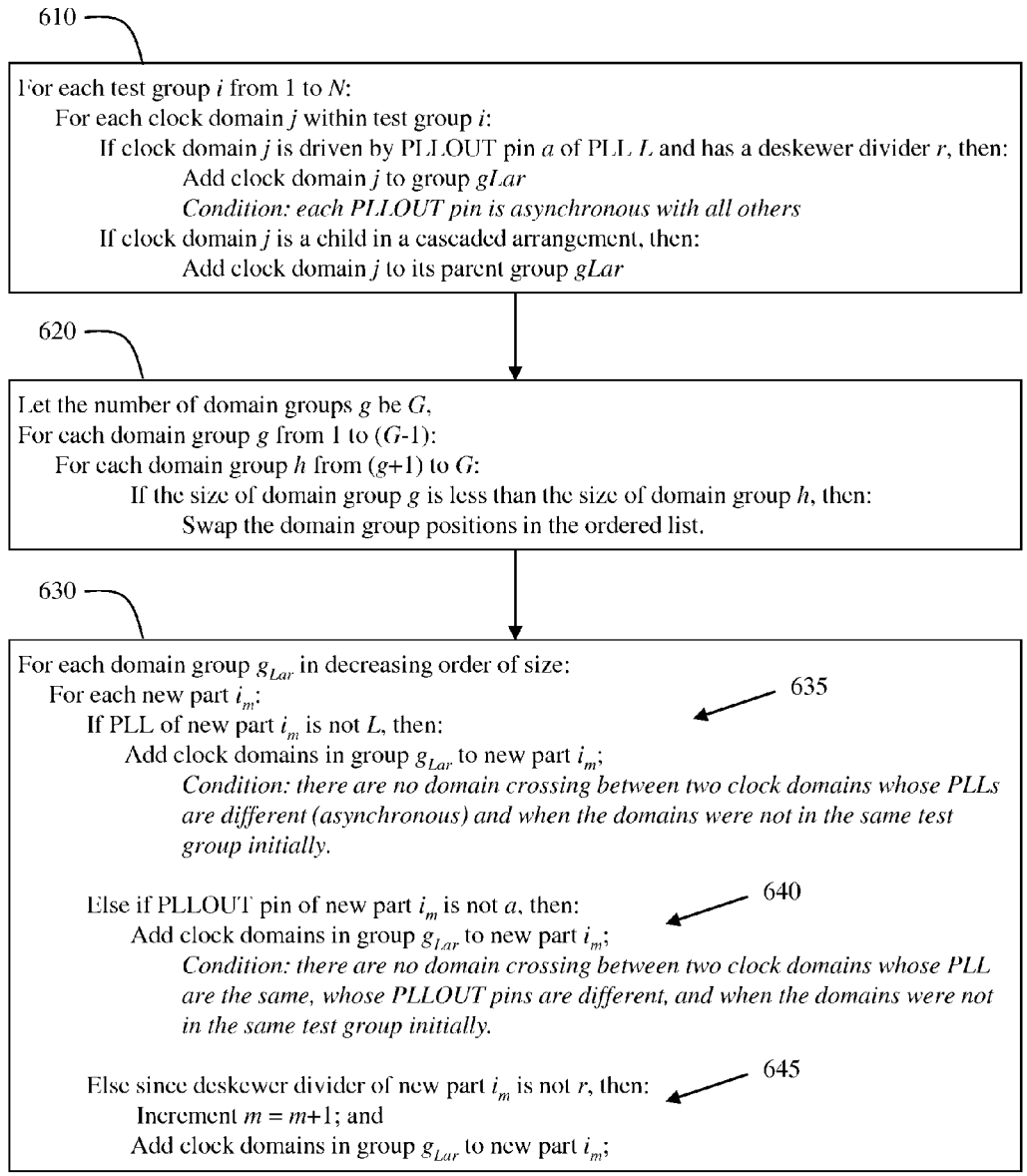

FIGS. 9-11 depict exemplary processes in accordance with aspects of the present invention. In particular, FIGS. 9-11 show methodologies of grouping domains to group clock edges as described herein and in accordance with aspects of the invention. In embodiments, the grouping processes are iterative processes that examine each domain of the test and place that domain in a respective group according to predefined rules. The steps of the grouping processes described herein may be carried out using a software application (e.g., a computer program product) running on a computer device comprising a processor and a memory.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 9 depicts an exemplary flow for a process of grouping domains to group clock edges in accordance with aspects of the present invention. At step 510, suitable programming and/or logic (e.g., via a program control described in greater detail herein) is used to determine whether all clock domains for a test have been grouped. In embodiments, this is accomplished by the software application examining the software model (e.g., stored data) of the integrated circuit for the domains. When all of the domains in the test have been grouped, the process ends. When all of the domains in the test have not yet been grouped, the process proceeds to step 515 where the next clock domain is determined for grouping consideration.

At step 520, the program control determines whether the current domain has a same frequency and duty cycle and is synchronous to any other clock domain already placed in any already-existing group "G". In embodiments, as domains are placed into groups, the software application updates and stores information regarding each group, such as group identity and domains included in the group. Data for comparing the frequency, duty cycle, and synchronous/asynchronous aspects of each individual group are available from the software model of the integrated circuit.

When the determination at step 520 is positive, i.e., the current domain under consideration has a same frequency/duty cycle and is synchronous to any other clock domain already placed in any already-existing group "G", then the process proceeds to step 525 where the current domain is added to that already-existing group "G" in which there is a match as determined in step 520. On the other hand, when the determination at step 520 is negative, i.e., the current domain under consideration does not have a same frequency/duty cycle and/or is not synchronous to any other clock domain already placed in any already-existing group "G", then the process proceeds to the next determination at step 530.

At step 530, the program control determines whether there are any already-existing groups "G" in which all of the domains within the group do not communicate with the current domain under consideration. Information regarding the communication between respective domains is obtained from the software model of the integrated circuit to make the determination in step 530. When the determination at step 530 is positive, i.e., there is an existing group in which all of the domains do not communicate with the current domain under consideration, then at step 535 the program control adds the current domain under consideration to that group. If there are plural already existing groups that satisfy the criteria of step 530, then at step 535 the current domain under consideration is added to the largest of the qualifying groups. The size of each group (e.g., for determining the largest group) may be defined by a number of domains within each group or the amount of logic within each group. For example, the amount of logic may include the numbers of gates, wires, and internal pins within the domains of each group contribute to the size of the group.

When the determination at step 530 is negative, i.e., there is not an existing group in which all of the domains do not communicate with the current domain under consideration, then at step 540 the program control creates a new group and adds the current domain to the new group. After any of steps 525, 535, and 540, the system updates the definition of each of the groups "G" (e.g., which domains are included in each group), and then returns to step 510 for handling of the next domain in the test. Data defining the groups may be created, maintained, updated, and stored by the system in any suitable manner. In embodiments, no groups "G" exist prior to the first iteration for any given test. As the program control iterates through all of the domains in the test, new groups may be created according to step 540 and existing groups may be updated according to steps 525 and 535. The result of the iterative process of FIG. 9, after all of the domains have been considered, is a plurality of groups "G" of clock domains in which all of the domains within a respective group may be modeled using a respective virtual test clock and four clock edges.

FIGS. 10 and 11 show block diagrams for a process of grouping domains (e.g., in order to group clock edges) in accordance with aspects of the present invention. It is often the case that test groups are pre-defined either by a customer or from a timing analysis. Such test groups provide a grouping of test clocks (e.g., domains) according to FIGS. 1 and 2, but without grouping of clock edges. As such, although domains are grouped together in these test groups, each domain still has its own clock and own clock edges. FIGS. 10 and 11 depict exemplary processes for separating the test clocks from these test groups, and re-grouping the test clocks into a plurality of parts where each part may be modeled using a single virtual test clock and a common set of clock edges. FIGS. 10 and 11 show steps of processes that, given a number of test groups with each test group having a number of domains, re-organizes the domains into a number of parts such that the number of parts is minimized and the amount of logic that is tested together is maximized. Similar to the groups "G" described in FIG. 9, a respective virtual test clock having four clock edges may be used to model each respective part described in FIGS. 10 and 11.

In accordance with aspects of the invention, the block diagram of FIG. 10 provides a method for separating a plurality of test clocks from test groups into a plurality of parts for at-speed test. Block 575 provides for separating the plurality of test clocks into a plurality of domain groups by adding to each domain group only those test clocks from among the test groups that originate from the same clock source and have a unique clock divider ratio. Block 580 provides for sorting the plurality of domain groups in decreasing order of number of the test clocks (or other size factor). Block 590 provides for: (i) creating a plurality of parts by taking each one of the plurality of domain groups in order of decreasing size, and adding each domain group to the first one of said plurality of parts in which the already present test clocks have a different clock source; and (ii) creating a new part when the test clocks present in a domain group originate from the same clock source as the test clocks present in all previously-created parts and the test clocks present in the domain group have a different clock divider ratio than the test clocks present in all previously-created parts.

Referring to FIG. 11, block 610 describes an iterative process for grouping the domains of the test groups into new groups $g_{Lar}$ according to the PLL (L), PLLOUT pin (a), and deskewer divider (r) of each domain. In embodiments, the system leverages the following conditions: asynchronous domains contained in the same predefined test group must be non-communicating with one another (e.g., only synchronous domains within a same test group may communicate with one another), and each PLLOUT pin is asynchronous with all other PLLOUT pins. Accordingly, in block 610 the system examines each predefined test group one at a time and examines each domain within each predefined test group, and determines whether a particular clock domain is driven by a PLLOUT pin (a) of a PLL (L) and has a deskewer divider (r) of an existing new group gLar. When the determination is positive, e.g., the PLLOUT pin (a), the PLL (L), and the deskewer divider (r) of the current domain match that of an existing group $g_{Lar}$, the current domain is added to that group $g_{Lar}$. The current domain is compared to all existing groups $g_{Lar}$ for a match. When a match is found, the current domain is added to that group. When a match is not found, a new group $g_{Lar}$ is created and the current domain is added to the new group. The new group is defined by the PLLOUT pin (a), PLL (L), and deskewer divider (r) of the current domain that caused the creation of the new group. In embodiments, when the current domain under consideration is a child in a cascaded arrangement, the current domain is added to the same group $g_{Lar}$ in which the parent domain is contained.

Block 620 describes an iterative process for arranging the new groups $g_{Lar}$ according to size from largest to smallest. In embodiments, the sorting in block 620 occurs after all of the domains have been assigned a new group $g_{Lar}$ in block 610. The size of each group may be defined by a number of domains within each group or the amount of logic within each group. For example, the amount of logic may include the numbers of gates, wires, and internal pins within the domains of each group that contribute to the size of the group.

Block 630 describes an iterative process for grouping the domains contained in the ordered groups $g_{Lar}$ into new parts according to aspects of the invention. In embodiments, at the first iteration, the domains contained in the largest group $g_{Lar}$ are added to a first part $i_m$. At the second iteration, the system determines whether the domains in second largest group $g_{Lar}$ may be added to the first part $i_m$, or whether a new part $i_{m+1}$ is created for the domains in the second largest group. The process continues through each of the groups $g_{Lar}$ in descending order from the largest to the smallest, determining whether the domains of each individual group $g_{Lar}$ can be added to an existing part or whether a new part is to be created for the domains of a particular group $g_{Lar}$. The system makes these determinations according to programming and logic (e.g., rules 635, 640, and 645 shown in block 630) and using data that is available from the software model of the integrated circuit. At the conclusion of the last iteration of block 630, there is a final test group that is divided into a plurality of parts where each part contains one or more clock domains whose clock edges may be grouped into a single virtual test clock for the test.

In embodiments, the steps for grouping of domains described with respect to FIGS. 9-11 are performed using software programming to create the test patterns. After the test patterns for each group are created, these test patterns are stored in the memory of test equipment. Then the test patterns are applied to the actual integrated circuit hardware pins using test equipment that has stored the test patterns. In embodiments, the steps described in FIGS. 9-11 take place before the test begins to create the test patterns and then on the fly during the test to apply the test patterns to each group of clock domains using four clock edges per virtual test clock.

Figure 12:
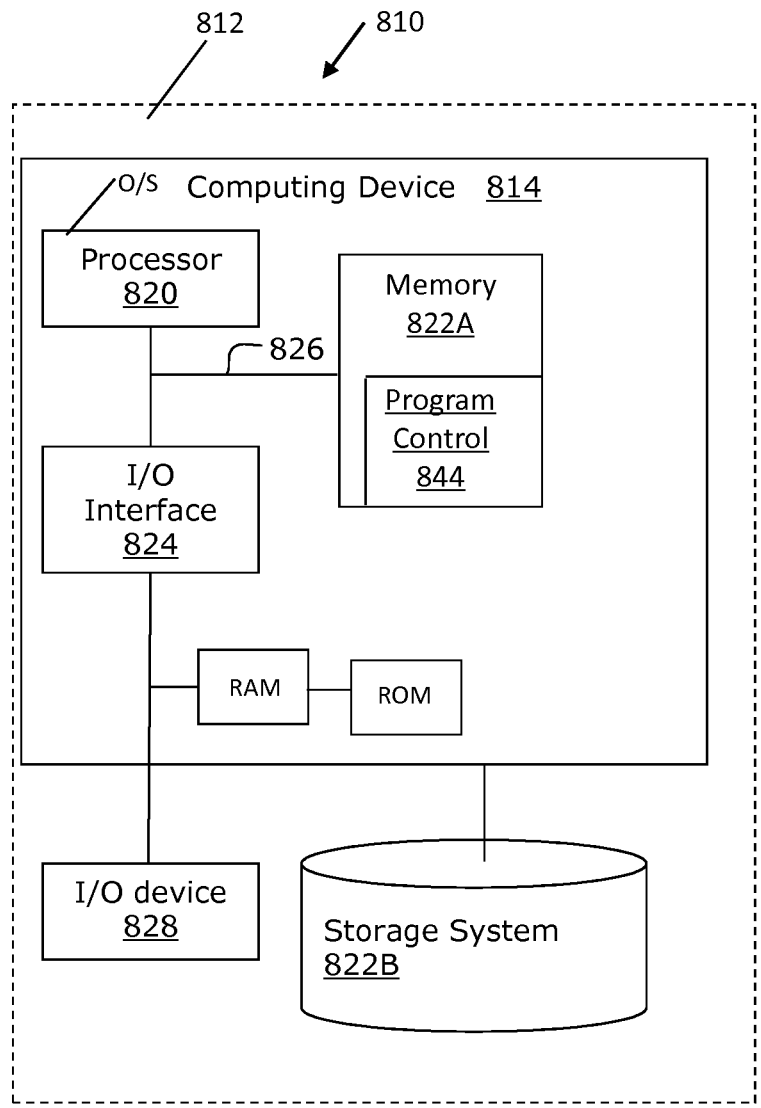
FIG. 12 shows an illustrative environment for managing the processes in accordance with the invention

FIG. 12 shows an illustrative environment 810 for managing the processes in accordance with the invention. To this extent, the environment 810 includes a server or other computing system 812 that can perform the processes described herein. In particular, the server 812 includes a computing device 814. The computing device 814 can be resident on a network infrastructure or computing device of a third party service provider (any of which is generally represented in FIG. 12).

The computing device 814 also includes a processor 820, memory 822A, an I/O interface 824, and a bus 826. The memory 822A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S). The memory (e.g., 822A) may store business intelligence, data mining, regression analysis and/or modeling and simulation tools for execution by the processor 820.

The computing device 814 is in communication with the external I/O device/resource 828 and the storage system 822B. For example, the I/O device 828 can comprise any device that enables an individual to interact with the computing device 814 (e.g., user interface) or any device that enables the computing device 814 to communicate with one or more other computing devices using any type of communications link. The external I/O device/resource 828 may be for example, a handheld device, PDA, handset, keyboard etc.

In general, the processor 820 executes computer program code (e.g., program control 844), which can be stored in the memory 822A and/or storage system 822B. Moreover, in accordance with aspects of the invention, the program control 844 controls an application that operates to perform one or more of the processes described herein. The application can be implemented as one or more program code in the program control 844 stored in memory 822A as separate or combined modules. While executing the computer program code, the processor 820 can read and/or write data to/from memory 822A, storage system 822B, and/or I/O interface 824. The program code executes the processes of the invention. The bus 826 provides a communications link between each of the components in the computing device 814.

The computing device 814 can comprise any general purpose computing article of manufacture capable of executing computer program code installed thereon (e.g., a personal computer, server, etc.). However, it is understood that the computing device 814 is only representative of various possible equivalent-computing devices that may perform the processes described herein. To this extent, in embodiments, the functionality provided by the computing device 814 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 812 is only illustrative of various types of computer infrastructures for implementing the invention. For example, in embodiments, the server 812 comprises two or more computing devices (e.g., a server cluster) that communicate over any type of communications link, such as a network, a shared memory, or the like, to perform the process described herein. Further, while performing the processes described herein, one or more computing devices on the server 812 can communicate with one or more other computing devices external to the server 812 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of grouping clock domains for testing an integrated circuit, the method being implemented using a computer device comprising a processor and comprising:
   separating a plurality of test clocks into a plurality of domain groups by adding to each respective one of the plurality of domain groups those test clocks that originate from a same clock source and have a unique clock divider ratio;
   sorting the plurality of domain groups in decreasing order of size; and
   creating a plurality of parts by performing one of the following for each respective one of the plurality of domain groups in the decreasing order of size:
   (i) adding the respective one of the plurality of domain groups to a first one of the plurality of parts in which already present test clocks have a different clock source; and
   (ii) creating a new part and adding the respective one of the plurality of domain groups to the new part when test clocks present in the respective one of the plurality of domain groups originate from a respective same clock source and have a different clock divider ratio as test clocks present in all previously-created parts.

2. The method of claim 1, further comprising modeling all of the test clocks contained within a respective one of the plurality of parts with a respective virtual test clock.

3. The method of claim 1, further comprising modeling all of the test clocks contained within a respective one of the plurality of parts using a same four clock edges.

4. The method of claim 3, further comprising using the modeling in an at-speed structural test of an integrated circuit.

5. The method of claim 1, wherein the size is defined by number of test clocks within each one of the plurality of domain groups.

6. The method of claim 1, wherein the size is defined by amount of logic within each one of the plurality of domain groups.

7. The method of claim 6, wherein the amount of logic comprises a number of gates, wires, and internal pins within each one of the plurality of domain groups.

8. A system, comprising:
   a computer device including a processor and a memory; and
   an application stored in the memory and executable on the processor, wherein the application operates to arrange a plurality of clock domains into a plurality of groups by iteratively performing one of the following for each respective one of the plurality of clock domains:
   (i) adding the respective one of the plurality of clock domains to an existing one of the plurality of groups when the respective one of the plurality of clock domains either: does not communicate with any other clock domains contained within the existing one of the plurality of groups, or has a same frequency and duty cycle and is synchronous to any other clock domain contained within the existing one of the plurality of groups; and
   (ii) creating a new one of the plurality of groups and adding the respective one of the plurality of clock domains to the new one of the plurality of groups when the respective one of the plurality of clock domains is synchronous with and at a different frequency than any other clock domain contained within any existing one of the plurality of groups.

9. The system of claim 8, wherein the application further operates to model all of the clock domains contained within a respective one of the plurality of groups with a respective virtual test clock.

10. The system of claim 8, wherein the application further operates to model all of the clock domains contained within a respective one of the plurality of groups using a same four clock edges.

11. The system of claim 8, wherein the system performs an at-speed structural test of an integrated circuit using the plurality of groups.

12. The system of claim 8, wherein the application further operates to sort the plurality of groups in decreasing order of size.

13. The system of claim 12, wherein the size is defined by at least one of: number of clock domains contained within each one of the plurality groups, and amount of logic contained within each one of the plurality of groups.

14. The system of claim 13, wherein the amount of logic comprises a number of gates, wires, and internal pins within each one of the plurality of groups.

15. A computer program product comprising a computer-readable code embodied on a computer readable storage medium, the computer-readable code when executed on a computer device causes the computer device to:

separate a plurality of test clocks into a plurality of domain groups by adding to each respective one of the plurality of domain groups those test clocks that originate from a same clock source and have a unique clock divider ratio;

sort the plurality of domain groups in decreasing order of size;

create a plurality of parts by performing one of the following for each respective one of the plurality of domain groups in the decreasing order of size:

(i) adding the respective one of the plurality of domain groups to a first one of the plurality of parts in which already present test clocks have a different clock source; and (ii) creating a new part and adding the respective one of the plurality of domain groups to the new part when test clocks present in the respective one of the plurality of domain groups originate from a same clock source and have a different clock divider ratio as test clocks present in all previously-created parts;

model all of the test clocks contained within a respective one of the plurality of parts using a respective group of clock edges; and perform an at-speed structural test of an integrated circuit using the plurality of parts.

16. The computer program product of claim 15, wherein each group of clock edges comprises four clock edges.

17. The computer program product of claim 16, wherein the modeling comprises creating a respective virtual test clock associated with each respective one of the plurality of parts.

18. The computer program product of claim 15, wherein the size is defined by number of test clocks within each one of the plurality of domain groups.

19. The computer program product of claim 15, wherein the size is defined by amount of logic within each one of the plurality of domain groups.

20. The computer program product of claim 19, wherein the amount of logic comprises a number of gates, wires, and internal pins within each one of the plurality of domain groups.

* * * * *